United States Patent
Son

(10) Patent No.: US 6,911,372 B2
(45) Date of Patent: Jun. 28, 2005

(54) METHOD OF FABRICATING STORAGE CAPACITOR IN SEMICONDUCTOR MEMORY DEVICE, AND STORAGE CAPACITOR STRUCTURE

(75) Inventor: Wook-Sung Son, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 10/453,736

(22) Filed: Jun. 4, 2003

(65) Prior Publication Data

US 2004/0007725 A1 Jan. 15, 2004

(30) Foreign Application Priority Data

Jul. 15, 2002 (KR) ........................................ 2002-41118

(51) Int. Cl.[7] ................. H01L 21/20; H01L 21/28; H01L 21/4763; H01L 21/461
(52) U.S. Cl. ................. 438/397; 438/386; 438/602; 438/640; 438/669; 438/672; 438/756; 438/757
(58) Field of Search ............................... 438/238, 713, 438/719, 756

(56) References Cited

U.S. PATENT DOCUMENTS 5,811,331 A * 9/1998 Ying et al. ................... 438/253
5,861,671 A * 1/1999 Tsai et al. .................... 257/750

OTHER PUBLICATIONS

Quirk et al., Semiconductor Manufacturing Technology (2001), Prentice Hall, pp. 457–459.*

* cited by examiner

Primary Examiner—Carl Whitehead, Jr.
Assistant Examiner—David L. Hogans
(74) Attorney, Agent, or Firm—Volentine Francos & Whitt, PLLC

(57) ABSTRACT

A storage capacitor has a double cylinder type structure, with a small cylinder in a lower part thereof and a cylindrical lower electrode structure disposed on the cylindrical contact plug. A method of fabricating the storage capacitor includes: forming a contact hole for exposing an activation region of a transistor; depositing a conductive film to form within the contact hole a contact plug of the storage capacitor having a void therein; opening an upper part of the void of the contact plug; and covering a surface of the device with material to form the storage capacitor electrode, to obtain the storage capacitor electrode having a double cylindrical structure.

5 Claims, 7 Drawing Sheets

US 6,911,372 B2

METHOD OF FABRICATING STORAGE CAPACITOR IN SEMICONDUCTOR MEMORY DEVICE, AND STORAGE CAPACITOR STRUCTURE

CROSS REFERENCES TO RELATED APPLICATIONS

This application claims priority under 35 U.S.C. §119 from Korean Patent Application 2002-41118, filed on Jul. 15, 2002, the contents of which are hereby incorporated by reference in their entirety as if fully set forth herein.

BACKGROUND AND SUMMARY

1. Technical Field

The present invention relates to a fabrication of a semiconductor device, and more particularly, to a method of fabricating a storage capacitor of a semiconductor memory device, and a structure thereof.

2. Description

In general, a semiconductor memory device, e.g., a DRAM, has a tendency of a rapid reduction in an area of a unit cell, according to an increase in density. A sufficient capacity of the capacitor constituting a memory cell is required so as not to impair an operating characteristic of the memory device. For example, a high-density device over 64 Mb typically uses a capacitor structure of a cylinder type. In comparison with a fin or trench structure, etc., as a conventional technique, such a cylinder type capacitor structure has a relatively large electrostatic capacity and also has an advantage in the aspect of leakage current.

A widely known method of fabricating the capacitor having the cylinder structure, in general, includes the procedure of fabricating a storage capacitor as a lower electrode by using, as a mask, photoresist as a photosensitive film and an oxide film spacer.

FIGS. 1 to 4 are sectional views showing a fabrication of a cylinder type storage capacitor according to such a technique. The sectional structures shown in FIGS. 2 to 4 are progressed in sequence, to thus result in the device shown in FIG. 1.

Referring first to FIG. 2, a transistor constructed of a device isolation film 4, a gate electrode 6, a spacer 8 and source/drain 10 is formed through a general fabrication process on a semiconductor substrate 2. Then, a bit line 14 connected to the transistor is formed through a contact plug 12. Herewith, the gate electrode 6 and the bit line 14 are electrically isolated through a dielectric film, e.g., a tetra-ethyl-ortho-silicate (TEOS) film, and the bit line 14 is coupled with the source/drain region 10a of the transistor through the contact plug 12. Thereon, a dielectric film 16, e.g., O₃-TEOS film is deposited entirely, and on an upper part thereof, a silicon nitride 18 is deposited. Subsequently, photoresist is placed on an upper part of the silicon nitride layer 18 and then a photolithography process is executed to thus form a photoresist pattern 20 for exposing the source/drain region 10b of the transistor. Through a use of this pattern as an etch mask, the silicon nitride 18 and the dielectric film 16 are anisotropically etched in sequence, to thus form a contact hole for exposing the source/drain region 10b of the transistor, as shown in FIG. 2.

With reference to FIG. 3, the photoresist pattern 20 shown in FIG. 2 is removed, and then a storage electrode conductive film that will be formed as a storage capacitor, e.g., a polysilicon film 22 doped with impurities is deposited with a predetermined thickness. Then, on an upper part of this polysilicon film 22, a photoresist pattern 24 for defining a region where a storage capacitor electrode will be formed, is formed. Thereon, a low-temperature oxide film is entirely deposited and then is etched-back, to thus form a spacer 26 in a side wall of the photoresist pattern 24. Through a use of the spacer 26 as the etch mask, the polysilicon film 22 is anisotropically etched by constant thickness, to produce the structure shown in FIG. 3.

Referring to FIG. 4, the photoresist pattern 24 is removed, and then the polysilicon film 22 is etched by using the spacer 26 as the etch mask, to thus form a storage capacitor electrode 22a of a cylinder type. Next, the spacer 26 is eliminated, and a dielectric film 28 is formed on an overall upper surface of the storage capacitor electrode of the cylinder type. Subsequently, a polysilicon film doped with impurities is entirely deposited, and is patterned, to thus form a plate capacitor electrode 30 on an upper part of the dielectric film 28, thus completing the structure, as shown in FIG. 1.

The method of fabricating such a conventional cylinder type capacitor has a limitation to largely use the electrostatic capacity of the storage capacitor that becomes a lower electrode.

That is to say, a tendency to higher density devices causes many restrictions in obtaining a larger sectional area between a storage capacitor electrode and a plate electrode. Especially, if a height of a contact plug for connecting the storage capacitor electrode with a source or drain region of the transistor is high, an electrostatic capacity can be reduced due to an increase of contact resistance.

Therefore, an object of the present invention is to provide a method of fabricating a storage capacitor in a semiconductor memory device and a storage capacitor structure, to address the conventional problems.

Another object of the present invention is to provide a method of fabricating a storage capacitor in a semiconductor memory device and a storage capacitor structure to be advantageously applied to a high-density device.

Still another object of the present invention is to provide a method of fabricating a storage capacitor in a semiconductor memory device and a storage capacitor structure so as to obtain a larger electrostatic capacity within a restricted area.

In accordance with one aspect of the present invention to achieve these objects, the method of fabricating a storage capacitor of a semiconductor memory device comprises the steps of: depositing a first dielectric film and a second dielectric film on a substrate in an area where a memory cell transistor has been formed, and forming a defined first photoresist pattern on an upper part of the second dielectric film; anisotropically etching the second and first dielectric films by using the first photoresist pattern as an etch mask, to form a first contact hole for exposing an activation region of the transistor; removing the first photoresist pattern, wet-etching the substrate with an etching solution having a difference in an etch ratio between the first and second dielectric films to form a second contact hole having a negative slope; depositing a conductive film to form within the second contact hole a contact plug of the storage capacitor having a void therein; performing an etchback to open an upper part of the void of the contact plug; covering a structure produced by the preceding steps with a third dielectric film, and then forming a second photoresist pattern for defining a region where a storage capacitor electrode is to be formed; dry-etching the third dielectric film exposed through the second photoresist pattern; and removing the second photoresist pattern, and covering a surface of the device with material to form the storage capacitor electrode, to obtain the storage capacitor electrode having a double cylindrical structure.

Herein, the first dielectric film is an oxide film, and the second dielectric film may be a nitride film, and the etching solution preferably is hydrofluoric acid (HF). The conductive film that will become the contact plug can be a doped polysilicon film.

To fabricate a plurality of memory cells, preferably, included are the steps of covering the surface with an oxide film after producing the storage capacitor electrode, and performing an etchback and a wet etching, to thus obtain the storage capacitor electrode divided into a unit of memory cell.

In accordance with another aspect of the present invention, the storage capacitor of a semiconductor memory device has a structure of a double cylinder that is extended by a constant depth from an upper part of a contact plug to a lower part thereof.

In accordance with yet another aspect of the invention, A capacitor for a semiconductor device comprises: a cylindrical contact plug disposed within a first dielectric film formed on a substrate, the cylindrical contact plug having a first inner diameter and a first outer diameter; a cylindrical lower electrode structure disposed on the cylindrical contact plug, the cylindrical lower electrode structure having a second inner diameter and a second outer diameter, where the second inner diameter is greater than the first inner diameter and the second outer diameter is greater than the first outer diameter; a second dielectric film covering an interior surface of the cylindrical contact plug and both interior and exterior surfaces the cylindrical lower electrode structure; and an upper electrode formed on the second dielectric film.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION

Hereinafter, a method of fabricating a storage capacitor in a semiconductor memory device and a storage capacitor structure according to preferred embodiments of the present invention will be described in detail with reference to FIGS. 5 through 13.

Constructive elements having the same or similar functions will be described with the same or similar referential numbers even though represented on different drawings.

FIGS. 5 to 13 are sectional views showing in sequence a fabrication of a cylinder type storage capacitor in accordance with an exemplary embodiment of the present invention.

Figure 1:
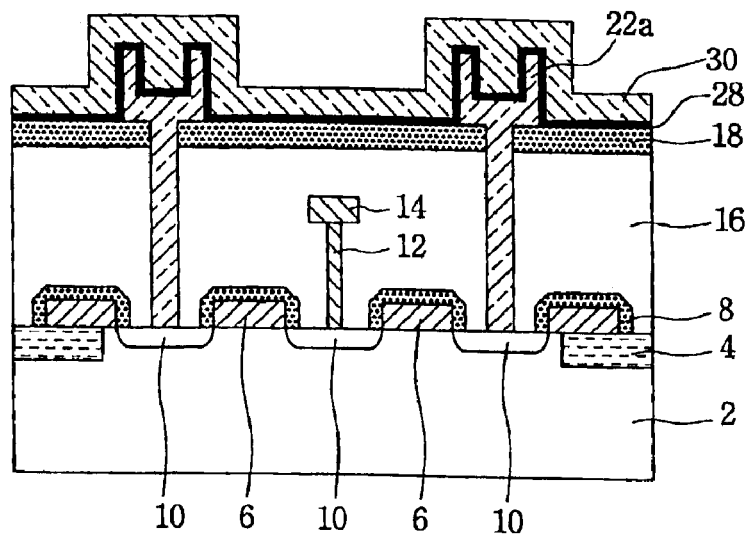
FIGS. 1 to 4 are sectional views showing a fabrication of a cylinder type storage capacitor.
Figure 2:
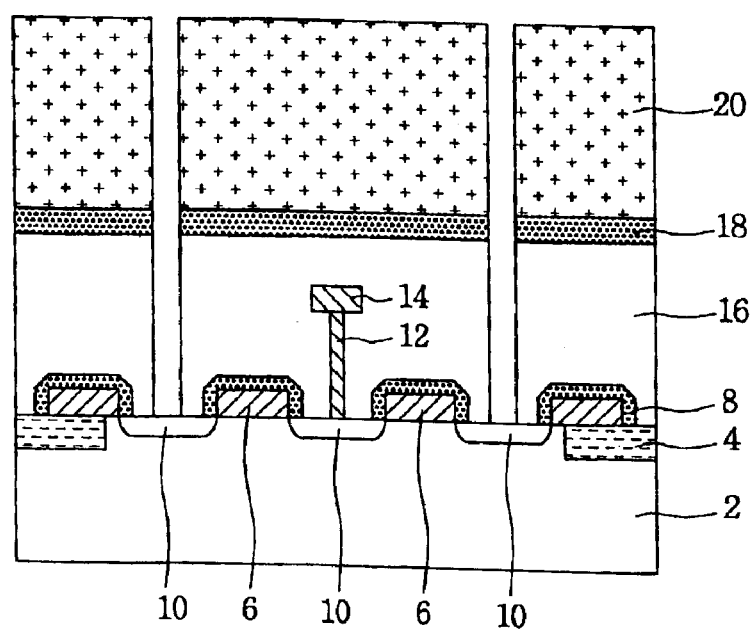
Figure 3:
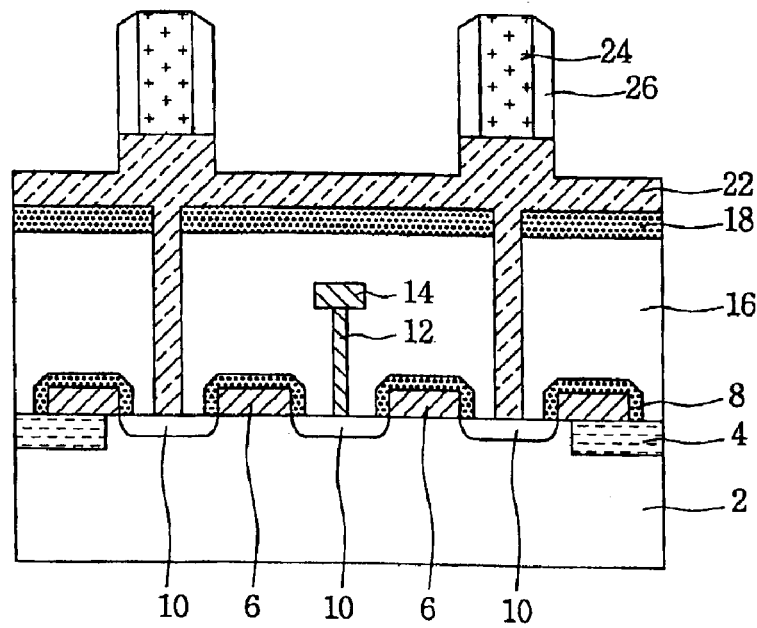
Figure 4:
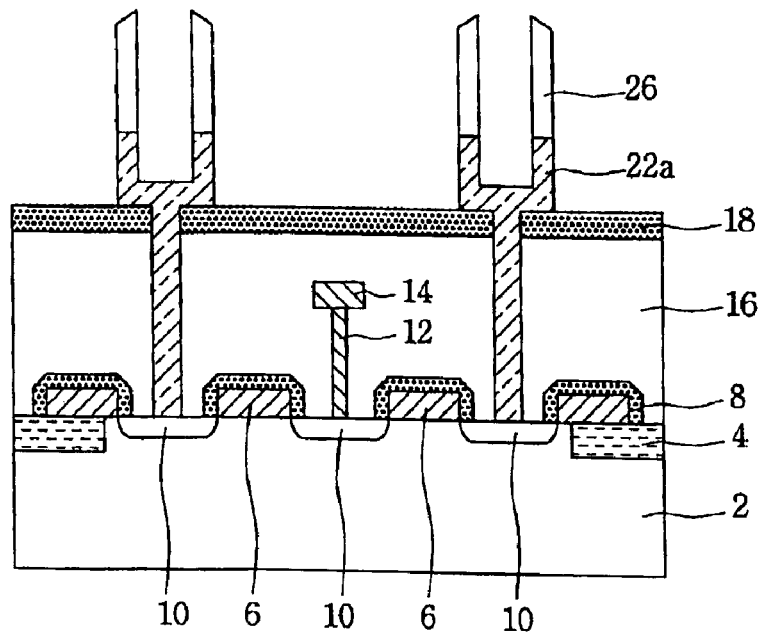
Figure 5:
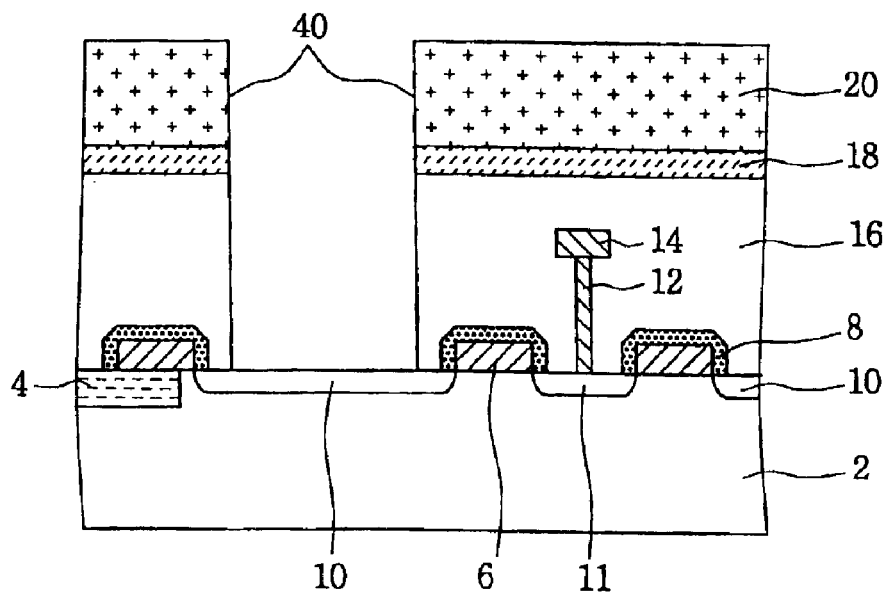
FIGS. 5 to 13 are sectional views showing in sequence a fabrication of a cylinder type storage capacitor having a double-cylinder type structure.

Referring first to FIG. 5, a memory cell transistor constructed of a device separation film 4, a gate electrode 6, a spacer 8 and source/drain regions 10, 11 on a semiconductor substrate 2 is formed through a general fabrication process. Then, a bit line 14 connected to the memory cell transistor is formed through a contact plug 12.

Subsequently, a dielectric film 16, e.g., boro-phospho-silicate-glass (BPSG), TEOS or a high-density oxide film, is deposited on the entire surface and thereon, a silicon nitride 18 is deposited. Next, on an upper part of the silicon nitride 18, photoresist is covered, and then a photoresist pattern 20 for exposing the source region 10 of the transistor through a photolithography process is formed. Through a use of this pattern as an etch mask, the silicon nitride 18 and the dielectric film 16 are anisotropically etched in sequence through a dry etch, to thus form a contact hole 40 for exposing the source region 10 of the transistor as shown in FIG. 5.

Figure 6:
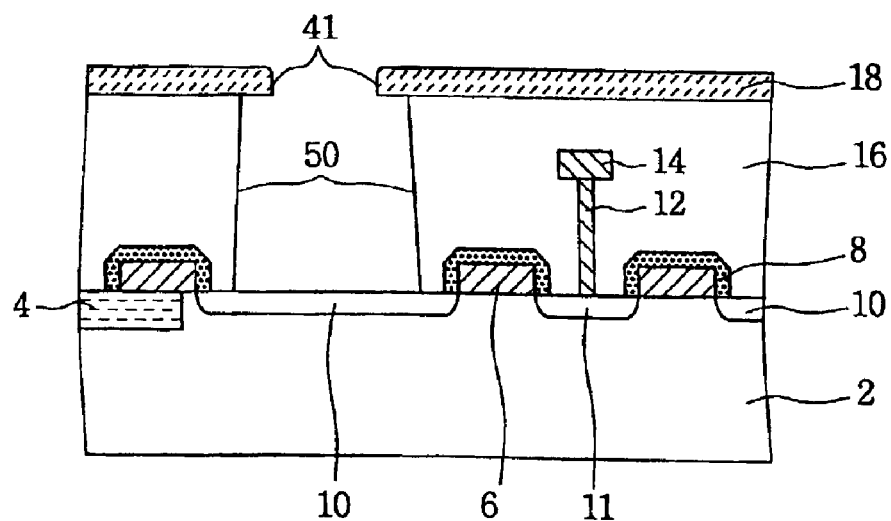

With reference to FIG. 6, the photoresist pattern 20 shown in FIG. 5 is removed by ashing, and then an etching solution, e.g., HF, is used to perform a wet etching, to thus form, in one body, contact holes 41, 50 having negative slopes that are provided by a difference of etch ratios between the silicon nitride film 18 and the dielectric film 16.

Next, with reference to FIG. 6, a conductive film of which a contact plug of the storage capacitor will be formed, e.g., polysilicon doped with impurities, is deposited on the entire surface with a predetermined thickness.

Figure 7:
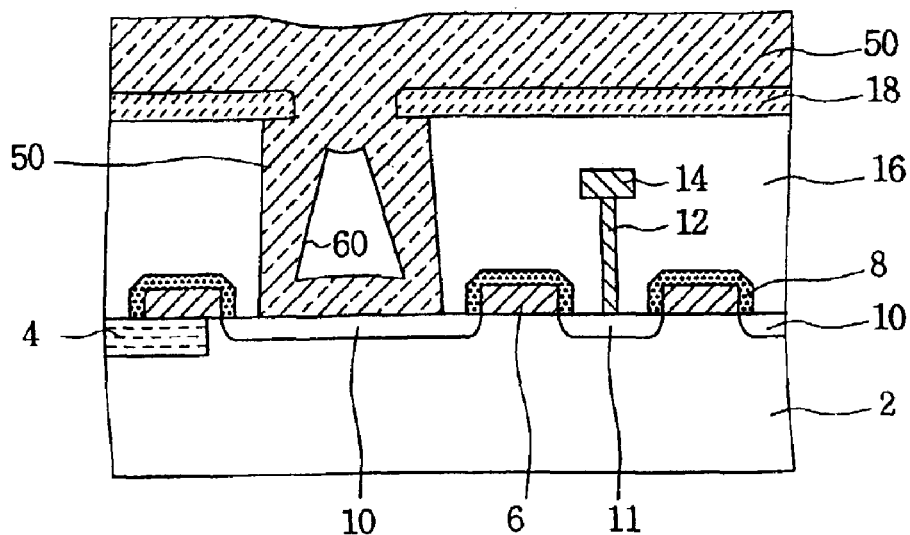

Then, as shown in FIG. 7, a void 60 is formed with a "negative slope" in the interior of the contact hole. Advantageously, the void 60 is usefully utilized for an increase of electrostatic capacity.

Figure 8:
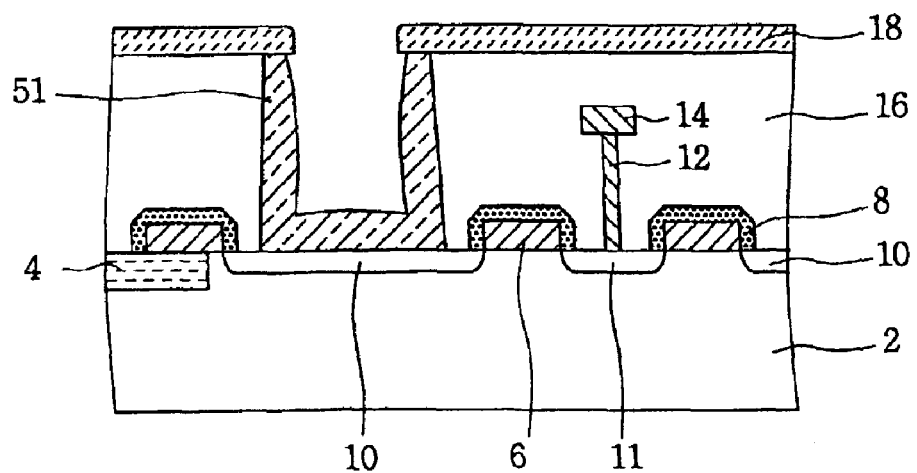

Subsequently to the stage shown in FIG. 7, an etchback is performed entirely, to thus obtain a result as shown in FIG. 8. In FIG. 8, an upper part of the void 60 is opened, to thus form a contact plug 51 of a spacer type in the interior of the contact hole.

Figure 9:
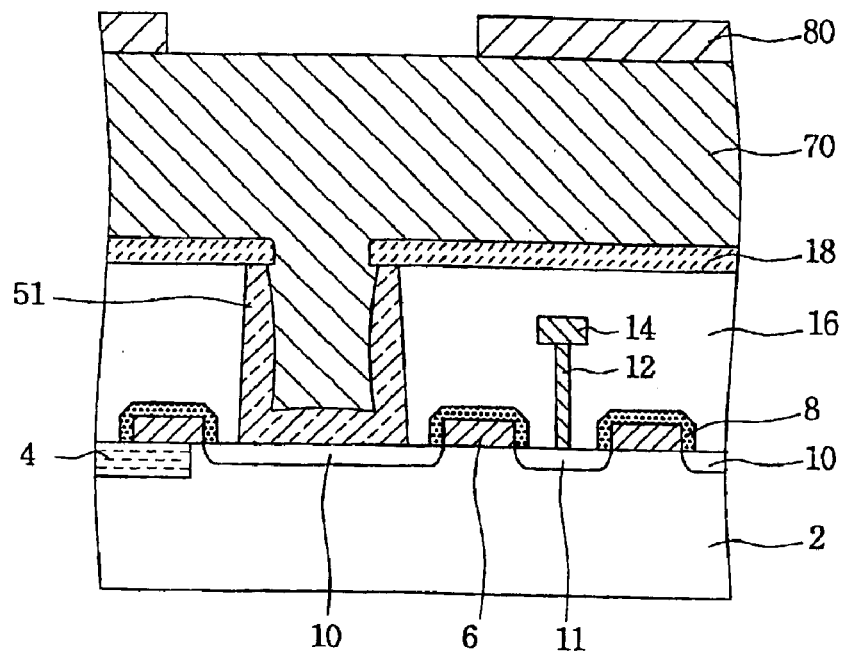

Following the stage shown in FIG. 8, an oxide film, e.g., a TEOS film 70 covers an entire surface, and a photoresist pattern 80 for defining a region where a storage capacitor electrode will be formed, is formed to thus result in the structure shown in FIG. 9.

Figure 10:
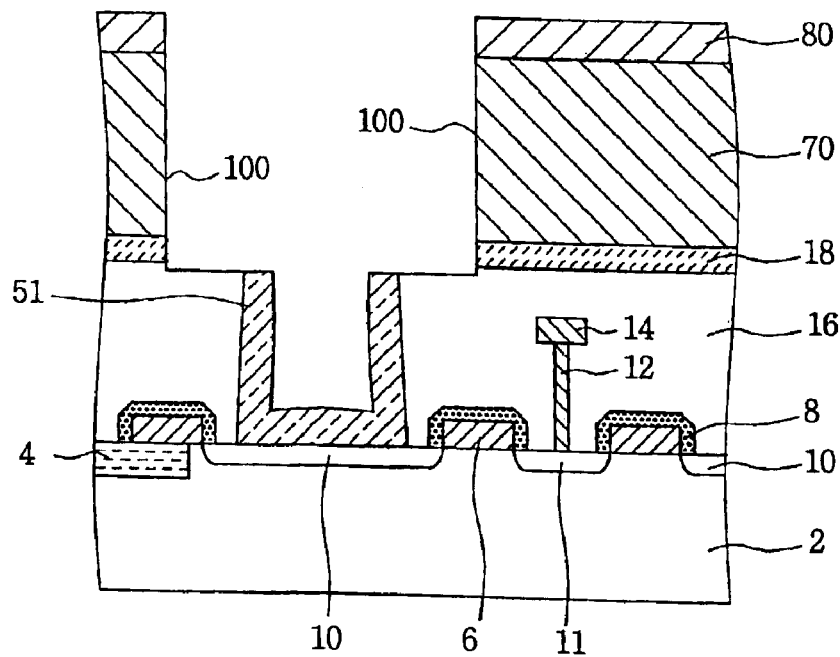

Subsequent to the stage shown in FIG. 9, a plasma dry etching process is performed, to thus etch the TEOS film 70 exposed by the photoresist pattern 80 and to result in the structure shown in FIG. 10.

Figure 11:
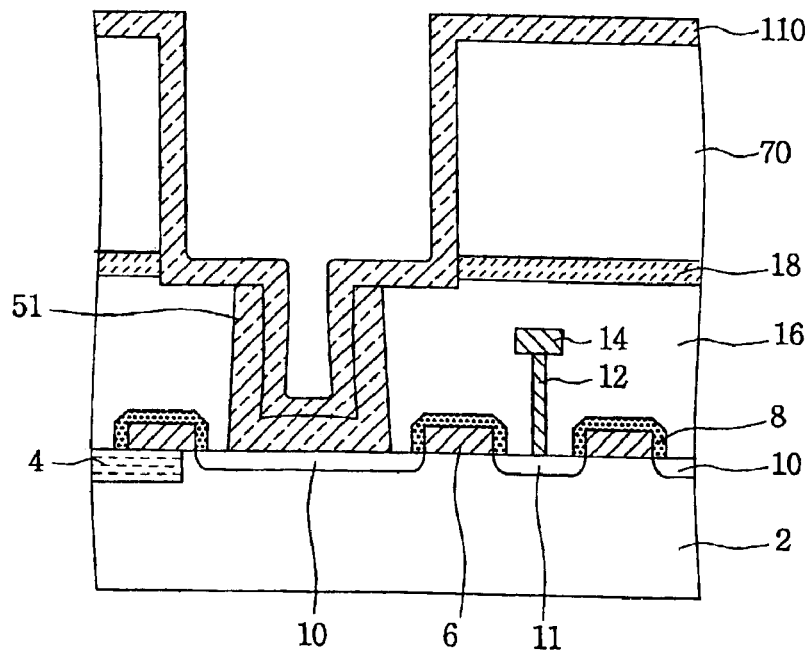

In FIG. 10, the photoresist pattern 80 is removed by ashing, and material for the lower capacitor electrode, e.g., a doped polysilicon film 110, is formed, to thus result in the structure of FIG. 11.

Referring to FIG. 11, beneficially the polysilicon film 110 covers the interior of the contact plug 51 whose upper part is opened, to thus form a double cylinder type structure, with a small cylinder in a lower part thereof and a cylindrical lower electrode structure disposed on the cylindrical contact plug. Such a structure for a lower capacitor electrode provides a greatly increased electrostatic capacity. Beneficially, a surface of the lower capacitor electrode formed thereby can be processed with hemispherical silicon grains (HSG) to increase the capacitance.

Figure 12:
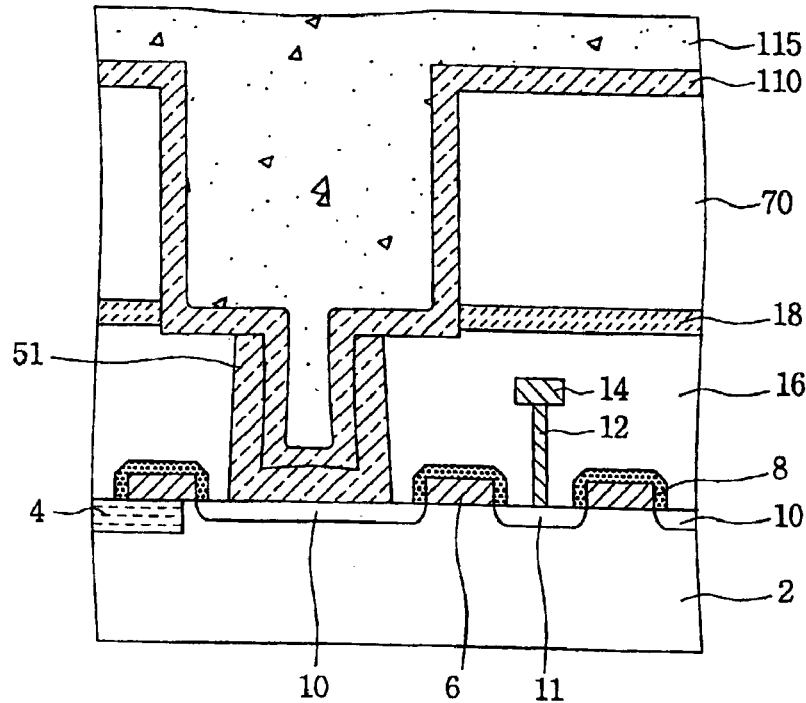
Figure 13:
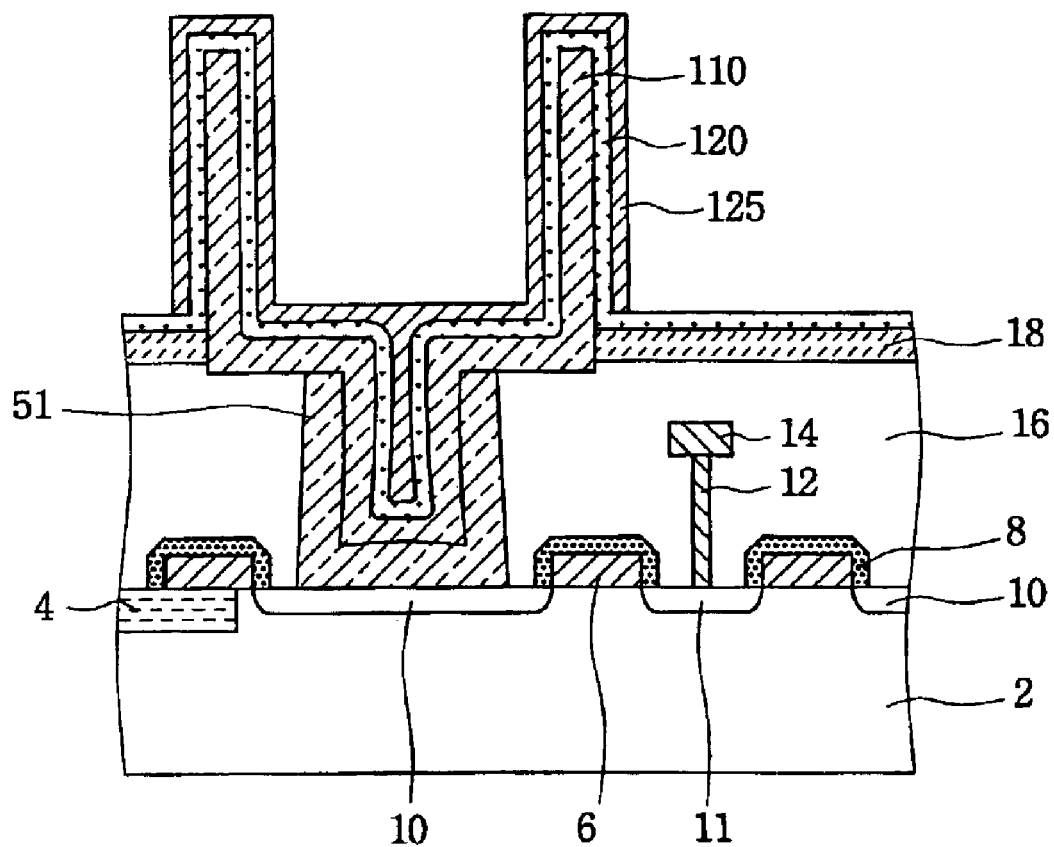

With reference to FIG. 12, an oxide film, e.g., an undoped silicon glass (USG) film 115, covers the structure shown in FIG. 11. Next, an etchback and a wet etching are performed, to thus obtain a plurality of lower capacitor electrodes divided into unit memory cells. Then, a capacitor dielectric film 120 is formed to thus result in the structure shown in FIG. 13. Thereon, a polysilicon film doped with impurities is deposited and patterned, to thus form an upper (plate) capacitor electrode 125 on an upper part of the capacitor dielectric film 120 and thereby to complete a capacitor of a DRAM memory cell.

As mentioned above, in accordance with the present invention, and in a method of fabricating a storage capacitor in a semiconductor memory device and a storage capacitor structure, a capacitor electrode is additionally formed even in the interior of a contact plug. Accordingly, a larger electrostatic capacity can be obtained in a restricted area.

Finally, although the present invention was described in detail above in connection with the preferred embodiments thereof, the scope of the invention is not so limited. Rather, various changes and modifications of the preferred embodiments, as will become apparent to those of ordinary skill in the art, are seen to be within the true spirit and scope of the invention as defined by the appended claims.

I claim:

1. A method of fabricating a storage capacitor of a semiconductor memory device, said method comprising:

depositing a first dielectric film and a second dielectric film on a substrate in an area where a memory cell transistor has been formed, and forming a defined first photoresist pattern on an upper part of the second dielectric film;

anisotropically etching the second and first dielectric films by using the first photoresist pattern as an etch mask, to form a first contact hole for exposing an activation region of the transistor;

removing the first photoresist pattern, wet-etching the substrate with an etching solution having a difference in an etch ratio between the first and second dielectric films to form a second contact hole having a negative slope;

depositing a conductive film to form within the second contact hole a contact plug of the storage capacitor having a void therein;

performing an etchback to open an upper part of the void of the contact plug;

covering a structure produced by the preceding steps with a third dielectric film, and then forming a second photoresist pattern for defining a region where a storage capacitor electrode is to be formed;

dry-etching the third dielectric film exposed through the second photoresist pattern; and removing the second photoresist pattern, and covering a surface of the device with material to form the storage capacitor electrode, to obtain the storage capacitor electrode having a double cylindrical structure.

2. The method of claim 1, wherein said first dielectric film is an oxide film, and said second dielectric film is a nitride film.

3. The method of claim 1, wherein said etching solution is hydrofluoric acid (HF).

4. The method of claim 1, wherein said conductive film that forms the contact plug is a doped polysilicon film.

5. The method of claim 1, further comprising the steps of:

covering the device an oxide film after obtaining the storage capacitor electrode; and performing an etchback and wet etching, to separate the storage capacitor electrode into unit memory cells.

* * * * *